United States Patent
Ham

(10) Patent No.: US 6,628,117 B2
(45) Date of Patent: Sep. 30, 2003

(54) MR APPARATUS WITH A NOISE REDUCTION SYSTEM

(75) Inventor: Cornelis Leonardus Gerardus Ham, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 19 days.

(21) Appl. No.: 10/024,781

(22) Filed: Dec. 19, 2001

(65) Prior Publication Data

US 2002/0118015 A1 Aug. 29, 2002

(30) Foreign Application Priority Data

Dec. 22, 2000 (EP) .............................. 00204807

(51) Int. Cl.[7] .............................................. G01V 3/00
(52) U.S. Cl. ...................................................... 324/318
(58) Field of Search ................................. 324/318, 322, 324/319, 307, 309

(56) References Cited

U.S. PATENT DOCUMENTS

| | | | | |
|---|---|---|---|---|
| 5,016,638 A | | 5/1991 | Hsieh | 128/653 A |
| 5,081,991 A | | 1/1992 | Chance | 128/653.2 |
| 5,990,680 A | * | 11/1999 | Mansfield | 324/318 |
| 6,107,799 A | * | 8/2000 | Sellers et al. | 324/318 |
| 6,184,684 B1 | * | 2/2001 | Dumoulin et al. | 324/318 |
| 6,239,680 B1 | * | 5/2001 | Nagano et al. | 335/296 |
| 6,414,489 B1 | * | 7/2002 | Dean et al. | 324/318 |
| 6,437,568 B1 | * | 8/2002 | Edelstein et al. | 324/318 |
| 6,469,510 B2 | * | 10/2002 | Drobnitzky | 324/318 |
| 6,492,816 B1 | * | 12/2002 | Feenan | 324/318 |

FOREIGN PATENT DOCUMENTS

| | | | | |
|---|---|---|---|---|
| EP | 1085336 A2 | 3/2001 | | G01R/33/28 |

OTHER PUBLICATIONS

Database WPI, Section PQ, Week 200104 Derwent Publications Ltd., London, GB; Class Q3, AN 2001–027218.
Patent Abstracts of Japan, Yoshino Hitoshi, "Nuclear Magnetic Resonance Imaging Apparatus Equipped With Electromagnetic Wave Shield Means," Publication No. 01145048, Jul. 6, 1989, Application No. 62303185, Feb. 2, 1987 XP 002194917 –& JP 2000 230604A (JEOl CO LTD), Aug. 22, 2000.

* cited by examiner

*Primary Examiner*—Edward Lefkowitz
*Assistant Examiner*—Dixomara Vargas
(74) *Attorney, Agent, or Firm*—John Vodopia

(57) ABSTRACT

The invention relates to a medical examination apparatus (1) which includes at least one switchable magnet whose magnetic field can be applied to an organism to be examined in the operating condition. The invention notably relates to an examination apparatus (1) which includes a coil (3) that generates a magnetic field when current flows therethrough, and also includes a receiving space (2) that is provided in the interior of the coil so as to receive the organism to be examined, the examination apparatus (1) being mounted on the floor (5) and being constructed in such a manner that a noise-absorbing material (16) is provided in a plane that is situated underneath the magnet (3).

9 Claims, 1 Drawing Sheet

MR APPARATUS WITH A NOISE REDUCTION SYSTEM

The invention relates to a medical examination apparatus, the magnetic field of which can be applied in operation to an organism to be examiner, that is, notably a human or animal.

BACKGROUND INFORMATION

In examination apparatus of this kind there is customarily provided a space for receiving a patient. The space is typically situated in the axial interior room of an outer coil. When current is applied to the coil, it produces a magnetic field that penetrates the patient who is arranged inside the coil and which is capable of creating a variety of effects that are used for imaging methods. In particular a plurality of magnet coils may be provided so as to generate first a static magnetic field, secondly an alternating field that acts as a gradient field for the acquisition of position information, and finally an RF magnetic alternating field so as to cause resonance. Overall a plurality of magnetic fields are superposed. The RF magnetic alternating field is capable of exciting magnetic resonance that can be used for the re-orientation of nuclear spins. Such a spin excitation can be evaluated as a spatially resolved image of the organism examined, because it is contained completely in the inhomogeneous magnetic field and hence the resonance frequency varies in any position of the inhomogeneous field.

One or more magnets may be embedded in a cryostat so as to enable a temperature below the critical temperature for superconductivity. In order to generate an adequately strong magnetic field, it is necessary to keep the field generating coil in the superconducting state. The cryostat that is filled with liquid helium of a temperature of 4.2° K is provided for this purpose.

The strong electromagnetic force (Lorenz force), being in the range of 100 kN, causes deformations of the coil that generates the gradient field. This results in a vibration that is transferred to the cryostat in which the gradient coil is mounted. This gives rise to a substantial amount of annoying noise, that is, in conjunction with switching operations for manipulating the gradient field whereby eddy currents are induced in the metal parts of the cryostat, and also in conjunctions with other sources of noise. The noise on the one hand is transferred as structure-borne noise directly to the floor, via parts of the apparatus such as the cryostats and its supports on the floor, and on the other hand as airborne noise to the environment. Consequently, it is also transferred in the room in which the examination apparatus is installed. As a result, the partitioning of the room, notably the floor, also acts as a conductor for the noise. Therefore, neighboring rooms and rooms that are situated below the examination apparatus are also exposed to a significant noise load.

It is an object of the invention to improve the aforementioned situation.

The transfer of noise through an air space underneath the examination apparatus to the floor (for example, an intermediate ceiling) on which the examination apparatus is mounted can be significantly reduced by providing a noise-absorbing material in a plane that is situated underneath at least one switchable magnet. In addition to the damping of vibrations within the supports on the floor, a second form of damping is thus realized, which second form not only reduces the transfer of vibrations via fixed components but also dampens the noise that is transferred through the air. The noise damping material can be used for reducing the acoustic load also without vibration damping in the supports.

Preferably, the noise insulation is provided between the supports on the floor, because at least one enclosure that elsewhere envelops the examination apparatus and already provides damping, for example a lining, can thus be dispensed with.

It will be evident that a noise-absorbing material may be provided not only in the lower region but also in other peripheral regions of the examination apparatus, for example, also additionally within a lining.

When the noise-absorbing material is precut, for example, as a mat or a similar element, it can also be introduced into already installed examination apparatus at a later stage.

Further advantages and details of the invention will become apparent from the following description of an embodiment of the invention that is shown in the accompanying drawing.

DETAILED DESCRIPTION OF THE PREFERRED EMBODIMENT

Figure 1:
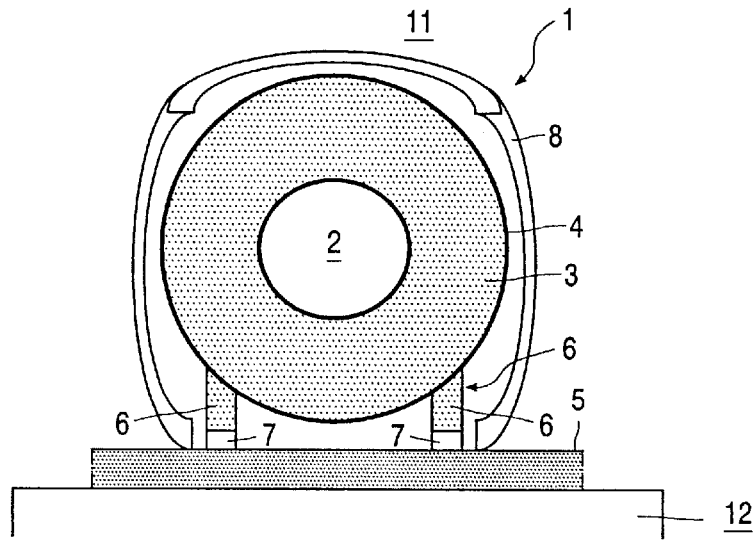
FIG. 1 is a diagrammatic front view of an examination apparatus that is mounted on the floor by way of feet.

The examination apparatus 1 shown is a magnetic resonance tomography apparatus. It includes an examination space 2 in which, for example a patient to be examined can be introduced. In principle humans as well as animals can be examined. Other organisms, however, can also, be examined.

The examination space 2 is enclosed by a magnet system 3 which includes at least one magnet that can be switched. The arrangement of the magnet coils or other magnets may vary in dependence on the configuration of the examination apparatus 1.

The magnet or magnets 3 are all embedded, for example, in a cryostat 4 in order to cool notably the coils to a temperature below a critical temperature for superconductivity. Switching operations, for example, during the generating of the magnetic gradient field, and any further noise sources in the examination apparatus 1 produce undesirable noise. Moreover, the cryostat 4 starts to vibrate. In order to prevent the transfer of such vibrations to the area of the floor 5, the support 6 via which the examination apparatus 1 is mounted on the floor 5 may be provided with vibration dampers 7 that are constructed, for example, as rubber elements and form part of the feet 6.

Figure 2:
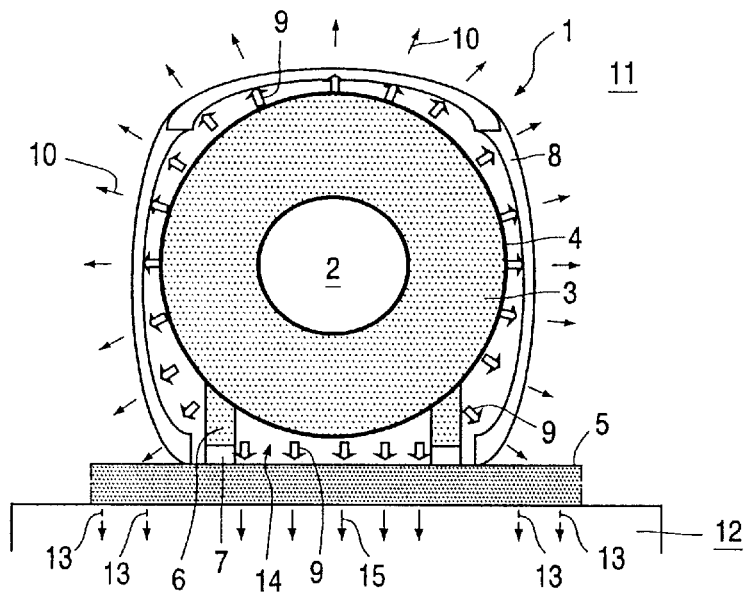
FIG. 2 is a representation that is similar to that of FIG. 1 in which the transfer of noise is diagrammatically indicated.

The present embodiment of the examination apparatus 1 is enclosed, that is, laterally outside and above the supports 6, by a lining 8 for optical enhancement as well as for noise insulation. As can be seen in FIG. 2, the lining 8 reduces the noise that is emitted by the cryostat 4, which noise is denoted by the wide arrows 9, in the space outside the lining 8 as indicated by the thin arrows 10. The noise load whereto the space 11 that surrounds the examination apparatus is exposed, therefore, is comparatively small because of the presence of the lining 8. Therefore, as is indicated by the dashed arrows 13, only a weak transfer of noise can take place from this outside space to a further room 12 that is situated below the room 11.

Vibrations of the floor 5, and hence also the transfer of the structure-borne noise by the cryostat via the supports 6, can be minimized by way of the vibration dampers 7. However, the transfer of noise in the lower region 14, below the arrangement of magnets 3, is impeded neither by the lining 8 nor by the vibration dampers 7, so that the noise 9 arising at that area is damped only by the intermediate ceiling 5; consequently, a comparatively large amount of noise is transferred, as indicated by the arrows 15, to the room 12 that is situated therebelow. The noise in the lower region 14, denoted by the arrows 9, is from approximately 10 dB to 20 dB higher than the level of the noise in the surrounding room outside the lining 8 as is indicated by the arrows 10.

Therefore, the major part of the transfer of noise to a room 12 that is situated therebelow takes place from the lower region 14 in which the lining 8 is absent. This transfer of noise is not essentially reduced when the supporting feet 6 are arranged closer to the center.

In order to reduce the noise load, notably for the room 12 that is situated below the examination apparatus 1, as is diagrammatically shown in FIG. 3 a noise-absorbing material 16 is provided in the region 14 underneath the magnet in accordance with the invention. The noise-absorbing material 16 may consist, for example, of a foam material that contains notably heavy components so as to realize effective damping. The foam material per se may be inhomogeneous and be provided with, for example additives of barium sulphate or other elements of higher density in comparison with the surrounding foam material. The use of, for example glass wool and/or rock wool is also possible.

Figure 3:
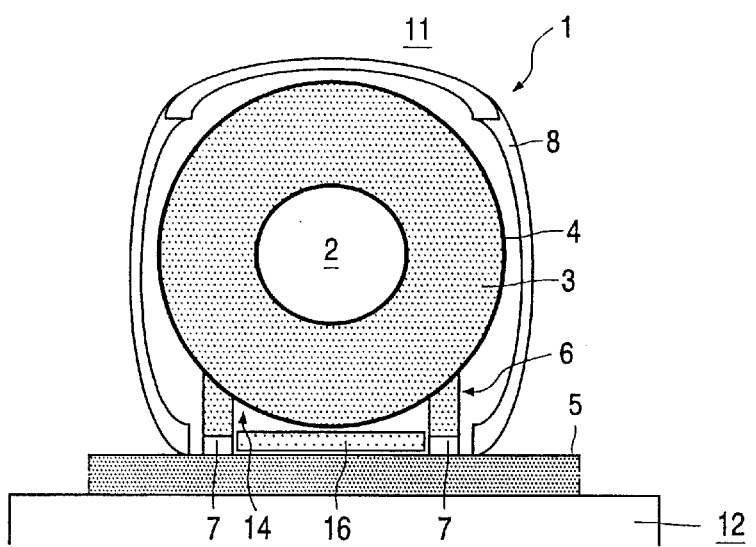
FIG. 3 is a representation that is similar to that of FIG. 1 in which a noise-absorbing material is provided underneath the magnet or magnets.

The space 14 can either be filled completely with noise-absorbing material 16 or, as is shown in FIG. 3, there may be provided a mat that leaves regions that are clear from the examination apparatus 1. A space between the feet 6 and the lateral lining 8 may also be filled with a noise-absorbing material 16.

The noise-absorbing material 16 can be adapted, for example in that it consists of a unitary body that is precut so as to be adapted to the dimensions of the space 14, after which it is slid into said space. The foregoing can also be carried out in already installed examination apparatus 1.

It is also possible to provide loose noise protection material for adaptation to the shape of the space 14 which is then filled essentially by the introduction of individual pieces.

The noise protection material 16 notably reduces the transfer of noise to the room 12 that is situated below. Moreover, the amount of noise that emanates to the room 1 from the sides is also reduced, because this noise is damped.

The introduction of a noise-absorbing material 16 is also possible when the lining 8 also extends into the region 14 underneath the magnet 3. It is to be considered that the lining can provide effective protection against noise in this region only when it is closed overall. Therefore, in that case a noise-absorbing material is provided at least so as to enclose the supporting feet 6. Additionally, or alternatively, the entire space 14 can be filled with noise protection material 16 within a lining 8 thus pulled down.

What is claimed is:

1. A medical examination apparatus comprising:
   a magnet system including at least one switchable magnet whose magnetic field acts on an organism to be examined in an operating condition, and a receiving space for receiving the organism to be examined in an interior space of the magnet system, said medical examination apparatus being mounted on a floor, wherein a noise-absorbing material is provided between the medical examination apparatus and the floor.

2. An examination apparatus as claimed in claim 1, wherein the medical examination apparatus further comprises projecting feet to mount the apparatus to the floor wherein the noise-absorbing material is provided between the projecting feet.

3. An examination apparatus as claimed in claim 1, wherein the medical examination apparatus is a tomography apparatus that operates on the basis of magnetic resonance.

4. An examination apparatus as claimed in claim 1, wherein the noise-absorbing material comprises a foam material.

5. An examination apparatus as claimed in claim 1, wherein the noise-absorbing material comprises a unitary member.

6. An examination apparatus as claimed in claim 5, wherein the noise-absorbing material is preformed so as to be adapted to fit within a cavity disposed beneath the examination apparatus (1).

7. An examination apparatus as claimed in claim 1, wherein the noise-absorbing material comprises a plurality of pieces for introduction in a space disposed between the examination apparatus and the floor to which the examination apparatus is mounted.

8. An examination apparatus as claimed in claim 1 further comprising a lining disposed in spaced relation about an exterior portion of the examination apparatus, the lining being adjacent the magnet system, the lining and magnet system defining a void therebetween.

9. An examination apparatus as claimed in claim 8, wherein the noise absorbing material is disposed in the void.

* * * * *